United States Patent [19]

Fifield et al.

[11] Patent Number: 5,010,524
[45] Date of Patent: Apr. 23, 1991

[54] CROSSTALK-SHIELDED-BIT-LINE DRAM

[75] Inventors: John A. Fifield, Underhill; Howard L. Kalter, Colchester, both of Vt.

[73] Assignee: International Business Machines Corporation, Armonk, N.Y.

[21] Appl. No.: 340,962

[22] Filed: Apr. 20, 1989

[51] Int. Cl.$^5$ .............................................. G11C 11/40
[52] U.S. Cl. ..................... 365/205; 365/206; 365/149
[58] Field of Search ............... 365/149, 206, 207, 208, 365/53, 51, 63, 205

[56] References Cited

U.S. PATENT DOCUMENTS 4,291,394  9/1981  Nakano et al. ...................... 365/206
4,366,559 12/1982  Misaizu et al. .................. 365/208 X

*Primary Examiner*—Joseph A. Popek
*Attorney, Agent, or Firm*—Howard J. Walter, Jr.

[57] ABSTRACT

This invention relates to semiconductor memories and includes a sense amplifier architecture in which sensed data bit or column lines are electrically isolated and shielded from their immediately adjacent active neighbors by utilization of non-selected bit lines as an AC ground bus. In its simplest embodiment, shielded bit line (SBL) architecture includes two pairs of opposed bit lines associated with a common sense amplifier. One of each of the bit line pairs is multiplexed into the sense amplifier and the other unselected bit line pair is clamped to AC ground to shield the selected bit line pair from all dynamic line-to-line coupling.

11 Claims, 5 Drawing Sheets

CROSSTALK-SHIELDED-BIT-LINE DRAM

FIELD OF THE INVENTION

This invention relates to random access memory arrays and more particularly to sense amplifier circuits and the design of such circuits to avoid data signal loss due to crosstalk between data bit lines caused by interelectrode coupling capacitance.

BACKGROUND OF THE INVENTION

Dynamic MOS memory technology has continually advanced by periodic increases in storage density since its commercial inception. As DRAMs move into the 16-Mbit density and beyond, the physical structures used in integrated circuit technology have been continually scaled to meet the density requirements.

The effects of dynamic line-to-line coupling on the nominal available data sense signal has long been recognized in DRAM design. Folded bit-line architecture, see for example RE 32,708 to Itoh, has been used in 256-Kb, 1-Mb, 4-Mb and 16-Mb DRAM designs for commonmode noise rejection caused by word line noise, plate bounce and substrate bounce disturbances. The distance between bit lines has shrunk from 3 microns in the 1-Mb generation to less than 0.5 microns for a 64-Mb design. To a great extent, as structures are scaled down, the electrical effects inherent in the technology are also scaled. In some instances there are some variables which cannot be scaled to the same degree as others. Vertical scaling cannot be fully utilized to offset this problem because resistance and electromigration considerations limit the extent to which scaling of conductors can be implemented. Such lack of scalability causes previously insignificant parameters to become more and more of a problem. As Physical dimensions are reduced to the sub-micron range, factors like line-to-line capacitive coupling are becoming a significant cause of sense signal loss and must be compensated for in circuit designs. A number of circuit innovations have been implemented throughout the history of DRAM technology including such features as dummy or reference cells, differential sensing and folded bit lines. All of these features have become critical in DRAM designs.

As designs for 16- and 64-Mbit are planned it has become apparent that the once-ignored line-to-line capacitance noise will be a dominant signal detractor. Although the material, and thus physical shape and profile, of data bit lines can have a significant effect on line-to-line coupling, the physical spacing of these lines will have the most significant effect on noise. Cottrell and Buturla, in their paper, "VLSI wiring capacitance," IBM J. RES. DEVELOP. VOL. 29, May 1985, pp. 277-288, have shown that line-to-line capacitance for a line separation of 1.0 micron amounts to more than 45% of the total capacitance of the line. Capacitive line-to-line coupling has been increasing dramatically in DRAM memory technology as improvements in lithography have permitted manufacture of conductors with submicron separation. This increased dynamic line-to-line coupling has become a major noise problem in DRAM array design and new circuit techniques are needed to obtain maximum signal levels and sense-amp sensitivity in a high speed DRAM.

One of the earliest techniques to reduce crosstalk between adjacent bit lines is described in the article "FET Stray Coupling Capacitance Equalization Technique," by Sonoda, IBM Technical Disclosure Bulletin, Vol. 17, No. 5, October 1974, p. 1355. This technique, known as twisted bit line architecture, physically interchanges or crosses adjacent complementary data bit lines so that equal portions of an adjacent pair of bit lines will receive compensating coupling noise. Twisted lines have also been used to reduce data line crosstalk. All twisted techniques involve the concept of alternating the physical positions of pairs of bit lines to achieve varying degrees of common mode noise rejection. One of these approaches, the modified twisted bit line, crosses bit lines associated with the same data bit and also crosses bit lines with a different data bit so that the twisting can cancel noise from between a bit-line pair and from adjacent bit lines from neighboring bit-line pairs. Such schemes require multiple levels of interconnect and associated contact area. These techniques are generally described in the article, "Twisted Bit Line Architectures for Multi-Megabit DRAM's," H. Hidaka et al., IEEE J. Solid-State Circuits, Vol. 24, No. 1, February 1989, pp. 21-27.

In practice, some problems exist in implementing twisted bit line architecture. One such problem is that three levels of conductor interconnect must be available to implement the required cross-overs needed for twisting. If the cross-overs are not to impact array cell density, they must be implemented at minimum conductor pitch. If the required bit line twists can be physically implemented, almost certainly there will be wasted silicon area due to the requirement of regular, usually four, breaks in the array area to implement the twists. Due to an increase in the complexity of the wiring and to an increase in the number of contact interfaces, reliability is seriously impacted.

Finally, the implementation of bit line twist increases the actual capacitance of the bit lines, somewhat negating its benefit.

Thus, in accordance with this invention, problems associated with diminishing bit line spacing in advancing DRAM technology, specifically that of increasing line-to-line capacitance, are easily solved without complex wiring techniques proposed by others. The disclosed shielded bit line array architecture eliminates the signal development noise and sense-amp set noise caused by dynamic line-to-line coupling without impact on density and yield found with twisted bit line architectures. Signal margin of the SBL array is further enhanced because a sense latch in a SBL array requires 76% less signal to set correctly than the folded array.

Accordingly, it is an object of this invention to improve the signal to noise ratio of data signals in high density DRAMs.

Another object of the invention is to increase the available signal margin in DRAM sensing circuits.

Yet another object is to improve the reliability of high density DRAMs by reducing the complexity of array wiring necessary to achieve reliable operation.

SUMMARY OF THE INVENTION

These and other objects of the invention are achieved by a sense amplifier architecture in which sensed data bit or column lines are electrically isolated and shielded from their immediately adjacent active neighbors by utilization of non-selected bit lines as an AC ground bus. In its simplest embodiment, shielded bit line (SBL) architecture includes two pairs of opposed bit lines associated with a common sense amplifier. One of each of the bit line pairs is multiplexed into the sense amplifier and the other unselected bit line pair is clamped to AC ground to shield the selected bit line pair from all dynamic line-to-line coupling.

These and other features of the invention will be more apparent to those skilled in the art from the following more particular description of the invention, as illustrated in the accompanying drawings.

DESCRIPTION OF THE DRAWINGS

Figure 1:
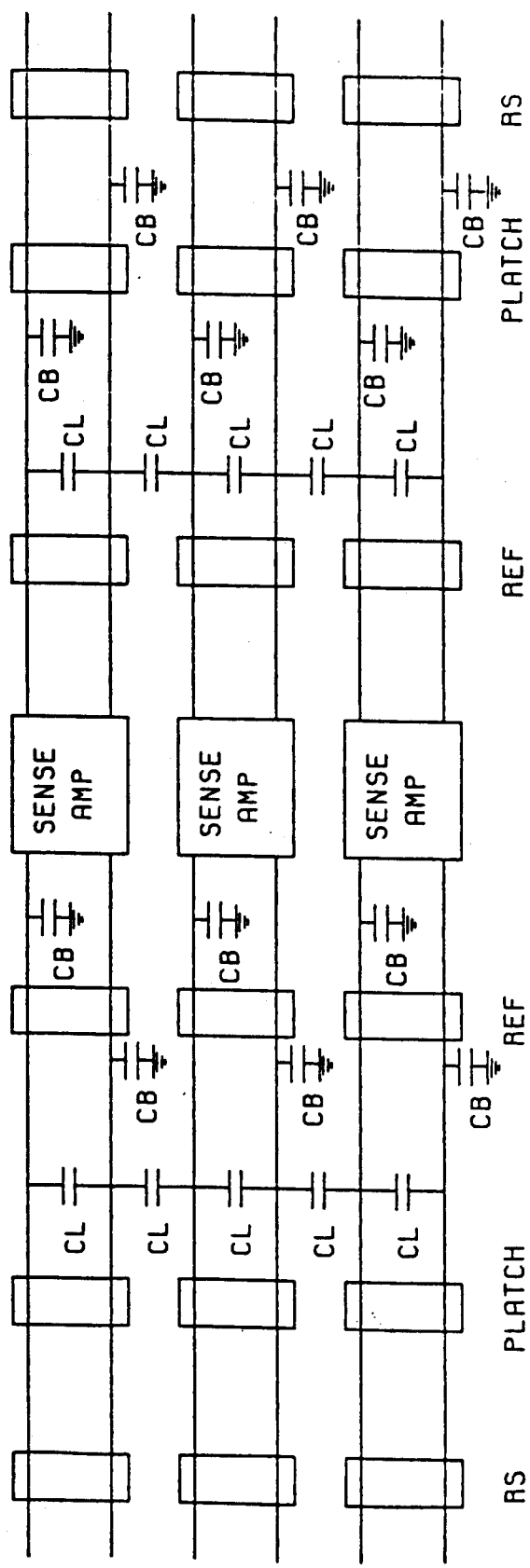
FIG. 1 is a schematic representation showing the various connections and capacitances present in DRAM arrays.

Referring to FIG. 1, the general organization of a typical DRAM array is shown in which an array of memory cells organized in columns and rows is split by a column of sense amplifiers SENSE AMP. The following designations are used in the figure. REF identifies the dummy or reference cells which when accessed provide a standard reference signal of Q/2 to one of the bit line pairs selected for sensing. Q represents the maximum charge a storage cell, not shown, can store. PLATCH identifies the p-type pull-up devices typically coupled to the bit lines in CMOS DRAMs to act as pull-up devices. RS identifies the restore devices which restore the bit lines to a predetermined potential, usually Vdd or Vdd/2, prior to initiation of a sensing operation. CB represents the capacitance between the bit lines and the semiconductor substrate over which they pass. CL identifies the capacitance between adjacent bit lines. In previous designs of DRAMs based on minimum physical dimensions of substantially greater than one micron, those having a density on the order of up to 4 Mbits, CL has had an insignificant effect on signals present on the bit lines to be sensed.

In typical DRAM designs in the past, the signal to be sensed was considered to be a only a function of the capacitance of the memory cell CS and that of the bit line capacitance CB by the relationship $$V_{signal} = f(CS/(CB+CS)).$$

This relationship is usually designated as the transfer ratio. Great efforts have been made to provide a transfer ratio as large as possible.

In recent years, the significance of the coupling capacitance CL has become an ever increasing factor in the development of sensed data signals. Computer simulations have been made on various sense amplifier architectures to quantify the noise from the setting of adjacent sense amplifiers. As large voltage changes occur on the neighboring bit lines, line-to-line coupling creates crosstalk, which increases the signal requirement to correctly set the latch in a particular sense amplifier. This crosstalk problem is most significant when a weak signal is being sensed by an imperfect sense amplifier, and surrounding sense amplifiers are setting with nominal conditions. The array schematic of FIG. 1 has been analyzed with the channel lengths mismatched by 0.05 microns to simulate the undesired but inevitable beta and VT mismatch seen in a routine manufacturing process. The results indicate that significant signal loss occurs due to the line-to-line capacitance CL. The charge available on the pair of bit lines coupled to a single sense amplifier can be shown to be described as follows:

For the bit line associated with the accessed memory cell $$Q = (Vdata \times CB) + (Vdata(n) - Vref(n-1))2CL = CS \times Vstore.$$

For the reference bit line $$Q = (Vref \times CB) + (Vref(n) - Vdata(n+1))2CL = (CS \times Vstore)/2.$$

The signal available for sensing is $$Vdata(n) - Vref(n) = \tfrac{1}{2}(CS \times Vstore(n))/(CB+4CL).$$

Where Vdata and Vref are the data and reference bit line voltages,

CB(x) is the bit line capacitance other than line-to-line capacitance CL,

CL is the line-to-line capacitance,

Vstore is the accessed cell storage voltage, n is the accessed bit line parameter, (n−1) is the next adjacent lower bit line parameter, and (n+1) is the next adjacent higher bit line parameter.

In the shielded bit line architecture of the invention, the sensed signal is:

$$Vdata(n) - Vref(n) = \tfrac{1}{2}(CS \times Vstore(n))/(CB+2CL).$$

In designs where CL represents as much as 15% of the total bit line capacitance, the shielded bit line architecture provides a 23% increase in available signal.

Figure 2:
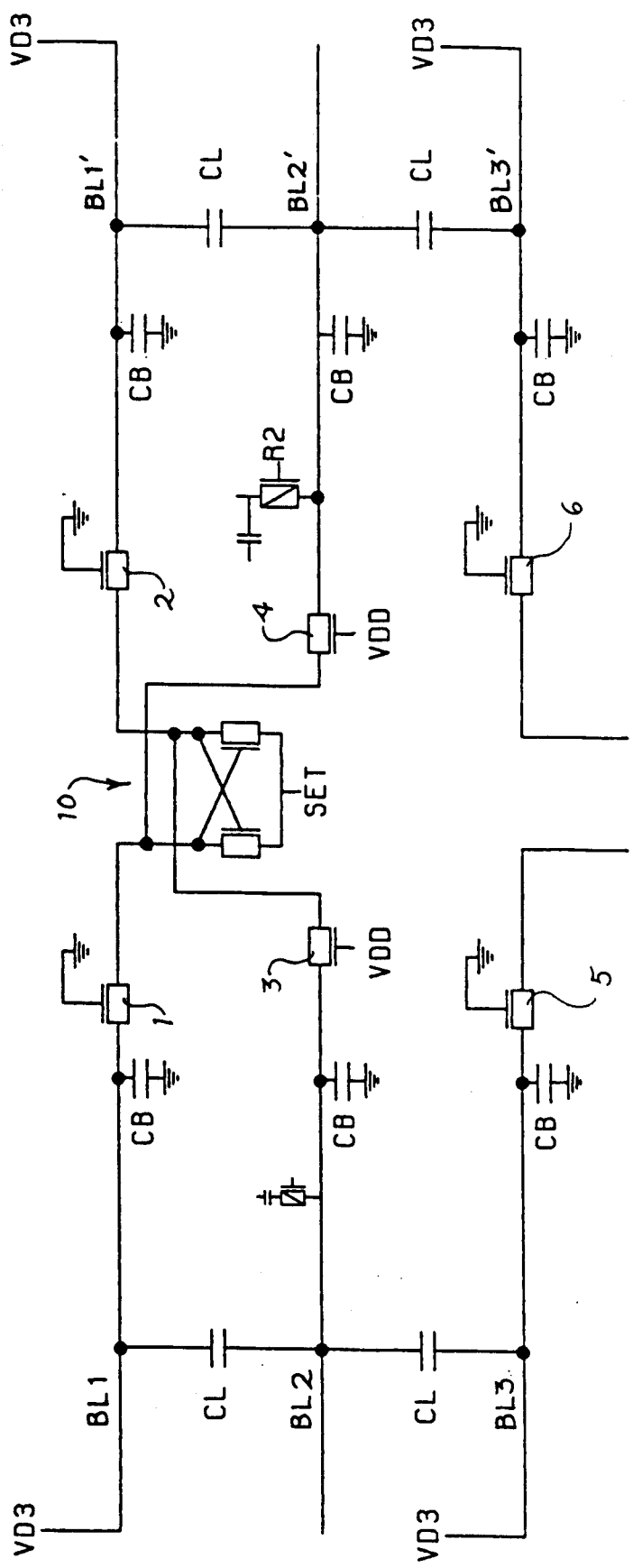
FIG. 2 is a schematic drawing of a selected pair of bit lines and their isolated adjacent bit lines as practiced by the invention.

The benefits of the shielded bit line (SBL) architecture of the invention is illustrated in FIG. 2 which shows an electrical equivalent of the arrangement during a sensing operation. As an example, data is to be sensed from the left half of the array from column line BL2. Access to the the column line pair BL2 and BL2' is facilitated by n-channel bit line isolation devices 3 and 4 which provide a low impedance path to the complementary nodes of sense amplifier 10. Interdigitized with the active bit lines are inactive bit lines BL1, BL1', BL3 and BL3'. In order to enable the crosstalk coupling isolation scheme to be effective the inactive bit lines are isolated from their respective sense nodes by placing isolation devices 1, 2, 5 and 6 in a high impedance state, i.e. off. While the inactive bit lines are isolated from the sense amplifier, they are coupled by devices (not shown in FIG. 2) to a predetermined source of potential VD3 which acts as a ground for AC signals. The inactive bit lines are effectively clamped to a fixed source of potential, preferably the same as used for precharging the bit lines prior to sensing. Thus, unlike the prior art in which all column or bit lines within a selected portion of an array are active simultaneously, for example in a folded bit line environment, only alternate lines are active. The inactive lines have the following attributes. First, being inactive inherently reduces crosstalk noise since no data signals are impressed on the lines. Second, because the lines are coupled to a fixed source of potential, the lines terminate the capacitive network associated with each sensed bit line. Third, the inactive bit lines act as a partial Faraday cage for the active lines and limit the extent to which other active bit lines can cause noise during sensing.

Figure 3:
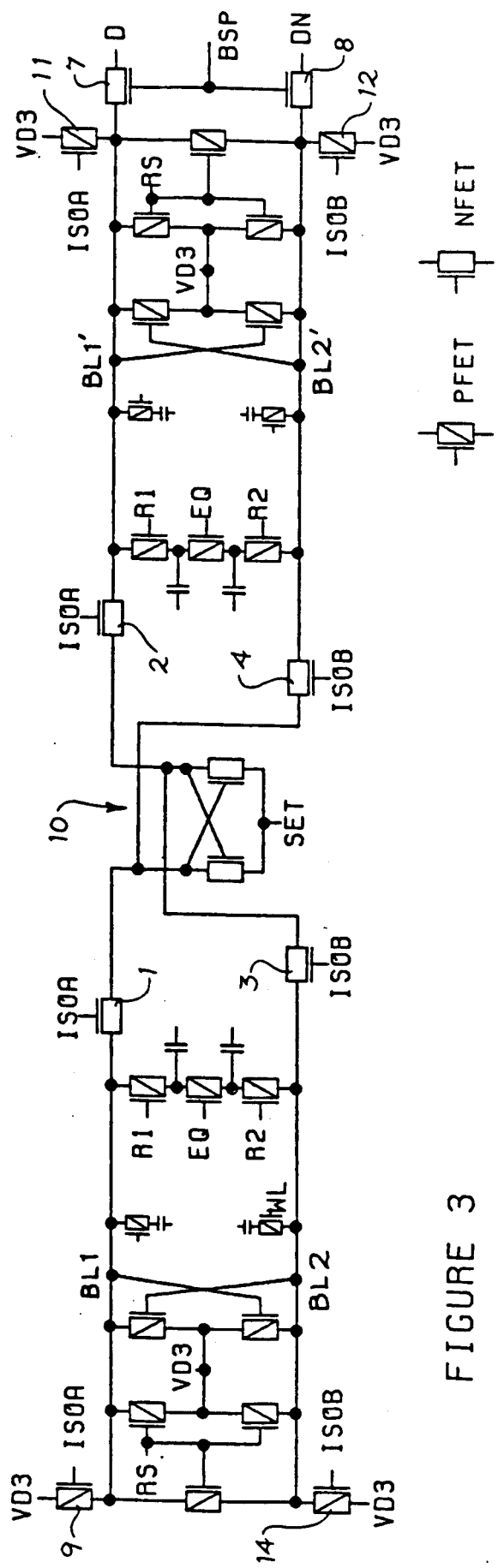
FIG. 3 is a schematic circuit showing the implementation of the invention in a single-ended sensing scheme.

Referring now to FIG. 3, there is shown a preferred embodiment of the invention as implemented in CMOS technology. The SBL array uses a multiplexed N-channel sense latch 10 which serves left and right P-channel arrays. Full-capacitor, half-voltage reference cells, shown as being responsive to input signals R1 and R2, are located in both array halves along with bit-line restore and equalize devices, shown as being responsive to restore clock RS and equalize clock EQ, respectively. P-type pull-up devices are used as in conventional CMOS latches. Leakage and substrate noise are minimized by placing the array cells and reference cells in an N-well biased at approximately 4.3 V. Bit-switch pair devices 7 and 8 are located on one end of circuit and provide a differential path to and from the sense amplifier 10 for high speed data transfer to input-output circuitry, not shown. Clock phase lines ISOA and ISOB control the N-channel bit line isolation devices 1, 2, 3 and 4 and are held at drain supply Vdd, nominally 5.0 Volts, during the time the bit lines are being restored. Array operation is at VD3, nominally 3.3 Volts. N-channel depletion devices could be used for isolation devices in a 3.3-V Vdd design. Decoded isolation clock ISOA and ISOB are also provided to the gates of p-channel devices 9, 11, 12 and 14 in order to enable the inactive bit lines in each sense cycle to be clamped to the predetermined potential VD3.

Figure 4:
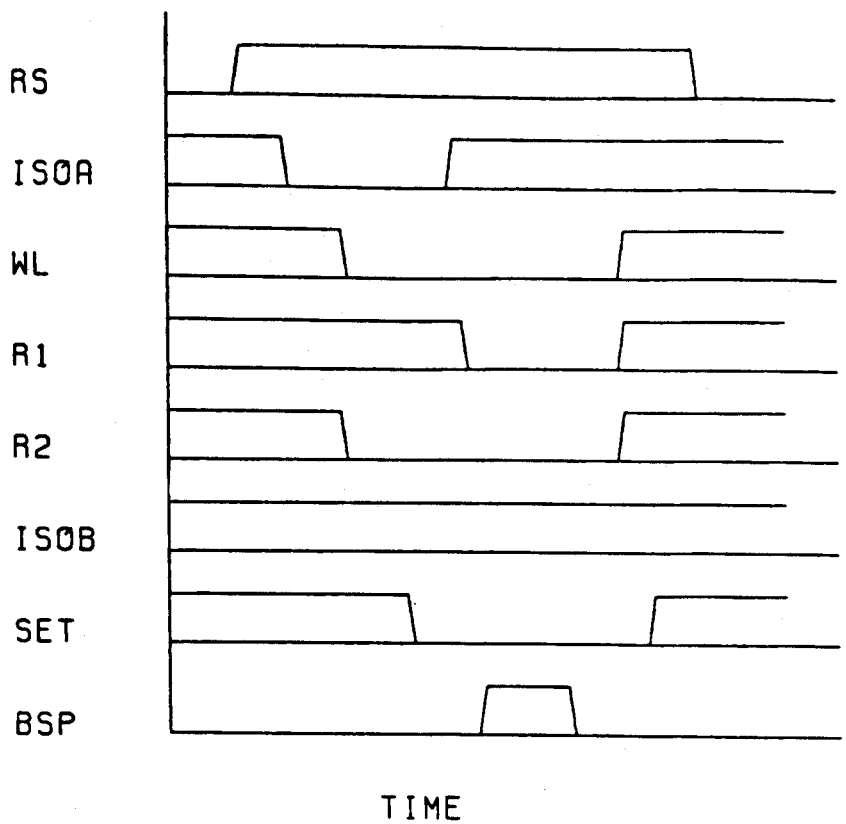
FIG. 4 is a phase timing diagram showing the relationship of the various clock phases for the operation of the circuit in FIG. 3.

Referring now to FIG. 4, the operation of the circuit in FIG. 3 will be described. At the beginning of an access cycle, following the restore of all of the bit lines and other internal nodes, restore clock RS goes inactive. Prior to selection of a specific word line, a decoded clock ISOA or ISOB falls to system ground. For example, if the memory cell responsive to word line WL located on bit line BL2 to the left of the sense amplifier is to be accessed. Isolation clock ISOA will go low turning off isolation devices 1 and 2. Note that the falling of ISOA acts to turn on the p-channel clamping devices 9 and 11 coupling the inactive bit line segments BL1 and BL1', now isolated from the sense amplifier, to array supply potential VD3. When the selected word line WL and the corresponding reference word line R2' become active, the data and reference signals are coupled to the active bit line segments BL2 and BL2'. In this manner, signals developing on both reference and data bit lines are shielded from all dynamic line-to-line coupling. Each active bit line pair will be subject to conditions described previously in connection with FIG. 2. As clock phase SET becomes active and begins to discharge one half of all of the selected bit lines toward ground, the rapid transition of the falling bit lines will not disturb the neighboring sense amplifiers due to the actively clamped shield line. It will be understood that the in practice one or more additional phased clocks may be applied to the SET node. Once the sense amplifier has been set, ISOA is returned to 5 Volts and reference word line R1 is activated enabling the now established levels in the sense amplifier to discharge the previously inactive bit lines. Data is now available differentially on both bit-line pairs. The bit switch line BSP is raised to 5 Volts enabling the data to be coupled to the data I/O buffer(s), not shown. It will be seen that data associated with cells on the other bit line half BL1 can be accomplished by selection of ISOA and grounding of ISOB during the sense operation.

Figure 6:
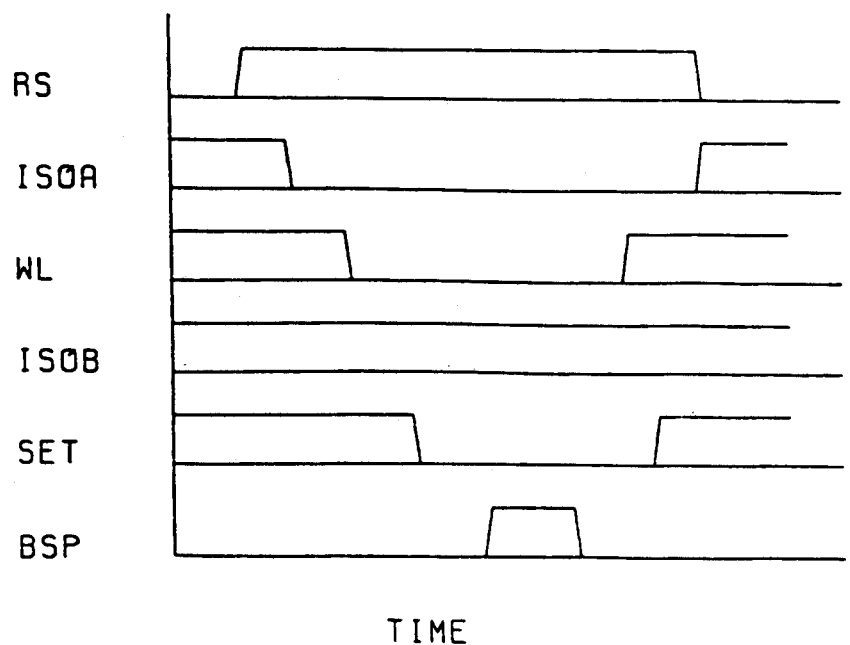
FIG. 6 is a phase timing diagram showing the relationship of the various clock phases for the operation of the circuit in FIG. 5.
Figure 5:
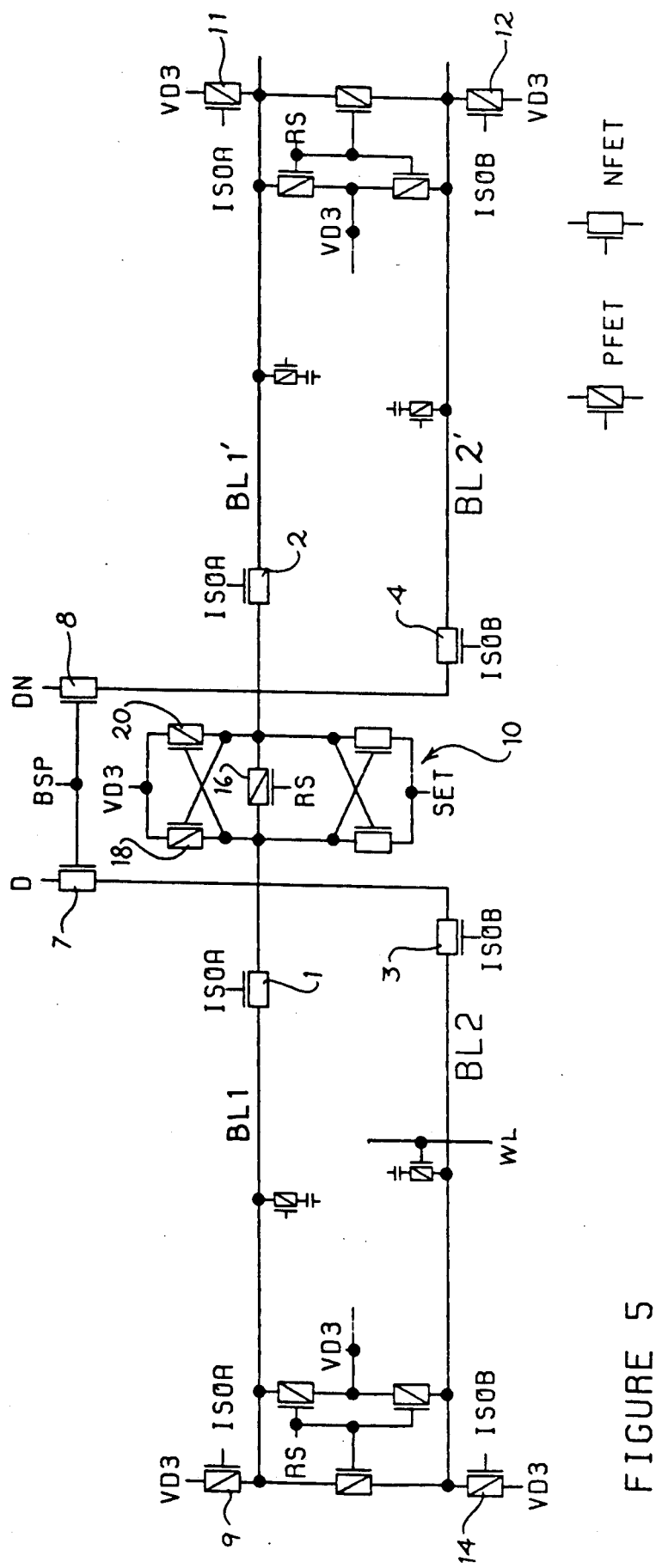
FIG. 5 is a schematic circuit showing a second embodiment of the invention in a center-accessed sensing scheme.

Referring now to FIG. 5, a second embodiment of the invention is illustrated in which sensed data is available from a central position in the array. Here bit lines to the right or left of the sense amplifier are both coupled to the same sense node, as opposed to the opposite nodes as in the embodiment in FIG. 3. Elements having similar functions to those in FIG. 3 bear like reference numbers. The following additional devices are provided. An additional equalization device 16 is provided to ensure equal precharge levels on all bit lines and to conserve charge during restore time. A single pair of p-channel pull-up devices 18 and 20 replace the two pairs in the other embodiment. Referring to the timing diagram of FIG. 6, the operation of the circuit of FIG. 5 will be described. At the beginning of a sense cycle, the restore clock is active to insure that all of the bit lines and sense nodes are precharged to the array supply potential VD3. After RS becomes inactive, one of the two decoded isolation clocks ISOA or ISOB is selected to become low (inactive). For example, if ISOA is deselected, devices 1 and 2 will turn off, isolating bit lines BL1 and BL1' from the sense amplifier 10. Selection of a word line WL causes data from a selected memory cell to be coupled on to bit line BL2. The sense amplifier is then set by driving node SET low. Once the sense amplifier has stabilized, the bit switch devices 7 and 8 are enabled to couple the sensed data to the data input/output circuitry.

It will be recognized by those skilled in the art that the specific array organization used to access data from the sense amplifiers is a matter of design choice. The following publications are hereby incorporated by reference in their entirety to provide any specific teaching which may be lacking in the above description. For single ended data access see the article "A High Performance Sense Amplifier for a 5 V Dynamic RAM," J. J. Barnes et al, IEEE J Solid-State Circuits, Vol. SC-15, No. 5, October 1980, pp. 831-839, or U.S. Pat. No. 4,085,457 to Itoh. For central data access see the article "High-density one-device dynamic MOS memory cells," K. Itoh et al, IEE PROC., Vol. 130, No. 3, June 1983, pp. 127-135.

While the invention has been described with respect to a limited number of embodiments, it will be recognized by those skilled in the art that various changes and additions may be made thereto without exceeding the intended scope of the invention. For example, the use of n-type and p-type devices may be freely interchanged. The specific data accessing technique used to extract the sensed data from the sense amplifiers is a design option selectable by the user.

What is claimed is:

1. A charge storage memory system having a plurality of memory cells arranged in columns and rows, each cell capable of being coupled to a respective one of a plurality of column lines, row select means for accessing memory cells, a plurality of sense amplifiers for sensing stored information associated with memory cells in predetermined columns, a first plurality of interdigitated column lines associated with a plurality of sense amplifiers, a second plurality of interdigitated column lines each arranged so as to be physically adjacent to at least one of the first plurality of column lines, means for sensing information on the first plurality of column lines, and means for coupling the second plurality of interdigitated column lines to a common source of predetermined potential at least during the time information available on the first plurality of column lines is being sensed.

2. The memory system of claim 1 wherein there is provided, means for alternatively sensing information available on the second plurality of column lines and means for coupling the first plurality of interdigitated column lines to a common source of predetermined potential at least during the time information available on the second plurality of column lines is being sensed.

3. The memory system of claims 1 or 2 wherein the first plurality of column lines is selectively coupled to the means for sensing.

4. The memory system of claim 3 wherein physically adjacent pairs of column lines are associated with a single means for sensing.

5. The memory system of claim 4 wherein the means for sensing comprises a cross-coupled latch responsive to input signals present on a pair of complementary input nodes.

6. The memory system of claim 5 wherein at least four different column lines are associated with each cross-coupled latch.

7. The memory system of claim 6 wherein the predetermined potential to which the interdigitated column lines are coupled equals that potential to which all of the column lines are precharged prior to the operation of the row select means.

8. The memory system of claim 7 wherein the predetermined potential is substantially equal to the supply potential provided to the memory array.

9. The method of sensing data in an array of capacitive storage cells arranged in columns and rows, including row selection means for providing access to a plurality of cells associated with a plurality of column lines, each column line being associated with at least one sense amplifier, including the steps of:

selecting a predetermined number of storage cells to be accessed, sensing data signals present on a first plurality of active alternate column lines while maintaining a second plurality of intervening alternate inactive column lines at a predetermined potential such that noise signals generated by active column lines is isolated by the intervening lines.

10. The method of claim 9 wherein the sensing of data on active alternate column lines includes the step of selectively multiplexing said column lines to respective sense amplifiers.

11. The method of claims 9 or 10 wherein the step of selecting a predetermined number of storage cells occurs substantially jointly with the step of maintaining the second plurality of inactive column lines at said predetermined potential.

* * * * *